(12) United States Patent
Maleev et al.

(10) Patent No.: US 10,837,902 B2
(45) Date of Patent: Nov. 17, 2020

(54) OPTICAL SENSOR FOR PHASE DETERMINATION

(71) Applicant: Tokyo Electron Limited, Tokyo (JP)

(72) Inventors: Ivan Maleev, Fremont, CA (US); Mihail Mihaylov, Fremont, CA (US); Hanyou Chu, Fremont, CA (US); Ching-Ling Meng, Fremont, CA (US); Qionglin Gao, Fremont, CA (US); Yan Chen, Fremont, CA (US); Xinkang Tian, Fremont, CA (US)

(73) Assignee: Tokyo Electron Limited, Tokyo (JP)

( * ) Notice: Subject to any disclaimer, the term of this patent is extended or adjusted under 35 U.S.C. 154(b) by 101 days.

(21) Appl. No.: 16/107,580

(22) Filed: Aug. 21, 2018

(65) Prior Publication Data

US 2019/0056320 A1 Feb. 21, 2019

Related U.S. Application Data

(60) Provisional application No. 62/548,382, filed on Aug. 21, 2017.

(51) Int. Cl.
*G01N 21/41* (2006.01)
*H01L 21/67* (2006.01)
(Continued)

(52) U.S. Cl.
CPC ... *G01N 21/4133* (2013.01); *H01L 21/02101* (2013.01); *H01L 21/6719* (2013.01);
(Continued)

(58) Field of Classification Search
CPC ....... G01N 21/4133; G01N 2021/1761; G01N 2021/4153; G01N 2021/4173;
(Continued)

(56) References Cited

U.S. PATENT DOCUMENTS

| 5,197,464 A | 3/1993 | Babb et al. |
| 5,291,879 A | 3/1994 | Babb et al. |

(Continued)

FOREIGN PATENT DOCUMENTS

| JP | 2005-101074 A | 4/2005 |
| WO | WO 01/04624 A1 | 1/2001 |

OTHER PUBLICATIONS

International Search Report and Written Opinion dated Dec. 14, 2018 in corresponding PCT/IB2018/056325 filed Aug. 21, 2018.

*Primary Examiner* — Jamil Ahmed
(74) *Attorney, Agent, or Firm* — Oblon, McClelland, Maier & Neustadt, L.L.P.

(57) ABSTRACT

An apparatus and a method for in-situ phase determination are provided. The apparatus includes a measurement chamber configured to retain a substance, and an entrance window mounted on a side of the measurement chamber. An exit window is mounted on an opposite side of the measurement chamber, and the exit window is parallel with the entrance window. The apparatus further includes a light source configured to generate an incident light beam. The incident light beam is directed to the entrance window at a non-zero angle of incidence with respect to a normal of the entrance window. The incident light beam passes through the entrance window, the measurement chamber and the exit window to form an output light beam. A detector is positioned under the exit window and configured to collect the output light beam passing through the exit window and generate measurement data.

20 Claims, 14 Drawing Sheets

(51) Int. Cl.
  *H01L 21/02* (2006.01)
  *G01N 21/17* (2006.01)
(52) U.S. Cl.
  CPC .............. *H01L 21/67253* (2013.01); *G01N 2021/1761* (2013.01); *G01N 2021/4153* (2013.01); *G01N 2021/4173* (2013.01); *H01L 21/67028* (2013.01)
(58) Field of Classification Search
  CPC ........... H01L 21/02101; H01L 21/6719; H01L 21/67253; H01L 21/67028
  See application file for complete search history.

(56) References Cited

U.S. PATENT DOCUMENTS

| | | | |
|---|---|---|---|
| 5,900,632 A | 5/1999 | Sterling et al. | |
| 6,049,081 A | 4/2000 | Sterling et al. | |
| 6,313,910 B1 * | 11/2001 | Garvey | G01J 1/4257 356/121 |
| 6,556,850 B1 | 4/2003 | Braig et al. | |
| 6,577,885 B1 | 6/2003 | Braig et al. | |
| 6,580,934 B1 | 6/2003 | Braig et al. | |
| 6,944,486 B2 | 9/2005 | Braig et al. | |
| 7,006,857 B2 | 2/2006 | Braig et al. | |
| 9,441,996 B2 | 9/2016 | Hill et al. | |
| 9,808,187 B2 | 11/2017 | Freitag | |
| 2003/0199742 A1 | 10/2003 | Braig et al. | |
| 2004/0034291 A1 | 2/2004 | Braig et al. | |
| 2004/0087841 A1 | 5/2004 | Braig et al. | |
| 2009/0273777 A1 * | 11/2009 | Yun | G01J 3/02 356/300 |
| 2010/0141928 A1 * | 6/2010 | Embry | G01N 21/4133 356/5.01 |
| 2010/0259604 A1 * | 10/2010 | Surman | H04N 13/368 348/54 |
| 2010/0267104 A1 * | 10/2010 | Green | C12M 21/02 435/173.1 |
| 2014/0350363 A1 * | 11/2014 | Freitag | A61B 5/1451 600/310 |
| 2015/0101419 A1 * | 4/2015 | Hill | G01F 1/74 73/861.04 |

\* cited by examiner

OPTICAL SENSOR FOR PHASE DETERMINATION

PRIORITY CLAIM AND CROSS-REFERENCE

This present disclosure claims the benefit of U.S. Provisional Application No. 62/548,382 filed on Aug. 21, 2017, which is incorporated herein by reference in its entirety.

BACKGROUND

Most substances turn into gas when heated above a certain temperature. Likewise, gases turn into liquid and/or solid when compressed beyond a certain pressure or cooled below a certain temperature. Materials such as carbon dioxide, when subjected to pressure and temperature above a so-called critical point, turn into so-called a supercritical fluid, with properties remarkably different from either liquid or gas. While generally similar to a liquid, supercritical $CO_2$ has near zero viscosity and exhibits near zero surface tension forces.

The development of semiconductor industry wafer cleaning solutions led to the utilization of supercritical fluids to remove wet cleaning agents and/or other residues from wafer surfaces. In one embodiment, a solvent, such as isopropyl alcohol (IPA) may be used to dissolve and remove contaminants. However, the solvent itself may become trapped on the wafer surface, particularly in high-aspect ratio (height-to-width) structures. Typically, liquid entrapped in a high-aspect ratio structure will be subject to a capillary effect. As the liquid evaporates, structure walls may be subjected to surface tension forces and collapse. One approach to solve this problem is by using supercritical fluid. Supercritical carbon dioxide may dissolve and replace e.g. isopropanol on wafer surface and in on-wafer structures. Once only pure supercritical $CO_2$ is left, the pressure in the cleaning chamber may be reduced until $CO_2$ turns into gas. Thanks to lack of surface tension forces and no capillary effect that process occurs without damaging structure walls. Once in gaseous phase, $CO_2$ escapes the wafer surface leaving no residue, damage, or contaminants.

One of the challenges is to accurately determine the phase/state of CO2 in a cleaning chamber to facilitate the cleaning process. A novel remote inspection method is required.

SUMMARY

The present disclosure provides a method and apparatus for determining the phase state of a substance by measuring the spatial and temporal distributions of the optical index of refraction in the substance volume, optionally in combination with concurrent measurements of substance temperature and pressure. The disclosure is based on theoretical and experimental studies, which show the index of refraction varying for different phases (gaseous, liquid, and supercritical phases) of a same substance.

The key element of the present disclosure is an optical sensor, which sends a shaped beam of light through the substance and measures displacement after the beam has traversed an optical path through the substance. The method is based on the Snell's law: the product of index of refraction n and of sine of the angle of incidence $\theta$ remains constant as the beam of light passes from one media/substance to another:

$$n_1 \sin(\theta 1) = n_2 \sin(\theta 2)$$

The angle of incidence is the angle between the direction of beam propagation ("a ray") and the normal to the interface surface between two media.

The input beam (e.g., incident light beam) is formed from the output of a light source, which is collimated and may be shaped into a line, a narrow "pencil" beam, or a structured (i.e., patterned) illumination profile distribution. The beam enters the measurement chamber of the optical sensor through a transparent window with respect to the incident light beam at substantially non-zero angle of incidence (i.e., with respect to a normal to the window surface), and exits the measurement chamber at the opposite end through a similar window. As the index of refraction of the substance inside the measurement chamber changes, so does the direction of propagation of the beam in the substance. At the opposite end of a chamber, the beam falls onto a sensor that detects the beam centroid position, i.e. the centroid of the spot illuminated by the beam, on the opposite end of the chamber. Accurate calibration is performed to establish the relationship between the beam centroid position and the refractive index of the substance. Accurate measurement of the index of refraction inside the chamber is obtained via the optical sensor based on the relationship between the beam centroid position and the refractive index of the substance. When a line or structured (patterned) illumination is used, the sensor may also allow the measurement of the spatial distribution of the index of refraction across different locations inside the measurement chamber. Independently, a sensor with sufficiently fast response time may allow to measure changes of the index of refraction over time as well as calculate properties of the temporal distribution, such as the autocorrelation function.

Given a theoretically or experimentally established relationship between the optical index of refraction, temperature, pressure, and physical state of substance (gas, liquid, supercritical), the sensor allows accurate determination of the state of substance from the optical index of refraction measurements. Furthermore, the sensor may be able to provide information about the substance uniformity and local state changes inside the volume being examined, such as the formation of layers and bubbles of supercritical fluids with physical properties locally different from average, gas bubbles inside a liquid, cavitation, etc.

An aspect of the present disclosure provides an apparatus for in-situ phase determination. The apparatus includes a measurement chamber configured to retain a substance, and an entrance window mounted on a side of the measurement chamber. An exit window is mounted on an opposite side of the measurement chamber, and the exit window is parallel with the entrance window. The apparatus further includes a light source configured to generate an incident light beam. The incident light beam is directed to the entrance window at a non-zero angle of incidence with respect to a normal of the entrance window. The incident light beam passes through the entrance window, the measurement chamber and the exit window to form an output light beam. A detector is positioned under the exit window and is configured to collect the output light beam passing through the exit window, and generate measurement data.

Another aspect of the present disclosure includes an apparatus for in-situ phase determination. The apparatus includes a measurement chamber configured to retain a substance, an entrance window mounted on a side of the measurement chamber and an exit window mounted on an opposite side of the measurement chamber. The exit window is parallel with the entrance window. The apparatus further includes a light source configured to generate an incident light beam. The incident light beam is directed to the entrance window at a non-zero angle of incidence with respect to a normal of the entrance window. The incident light beam passes through the entrance window, the measurement chamber, and is reflected on the exit window to form a reflected light beam. The reflected light beam passes through the measurement chamber and the entrance window to reach a detector. The detector is mounted above the entrance window and is configured to receive the reflected light beam passing through the entrance window and generate measurement data.

Yet another aspect of the present disclosure provides a method for in-situ phase determination. In the disclosed method, an incident light beam is directed to an entrance window of a measurement chamber at a non-zero angle of incidence with respect to a normal of the entrance window. The entrance window is mounted on a side of the measurement chamber, and the measurement chamber retains a substance. An output light beam is collected via a detector. The incident light beam passes through the entrance window, the measurement chamber, and an exit window to form the output light beam. The exit window is mounted on an opposite side of the measurement chamber and parallel with the entrance window. The detector is positioned below the exit window. A measurement data is generated and a property of the substance retained in the measurement chamber is determined based on the measurement data. A manufacturing process is controlled based on the determined property.

The foregoing paragraphs have been provided by way of general introduction, and are not intended to limit the scope of the following claims. The described embodiment, together with further advantages, will be best understood by reference to the following detailed description taken in conjunction with the accompanying drawings.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
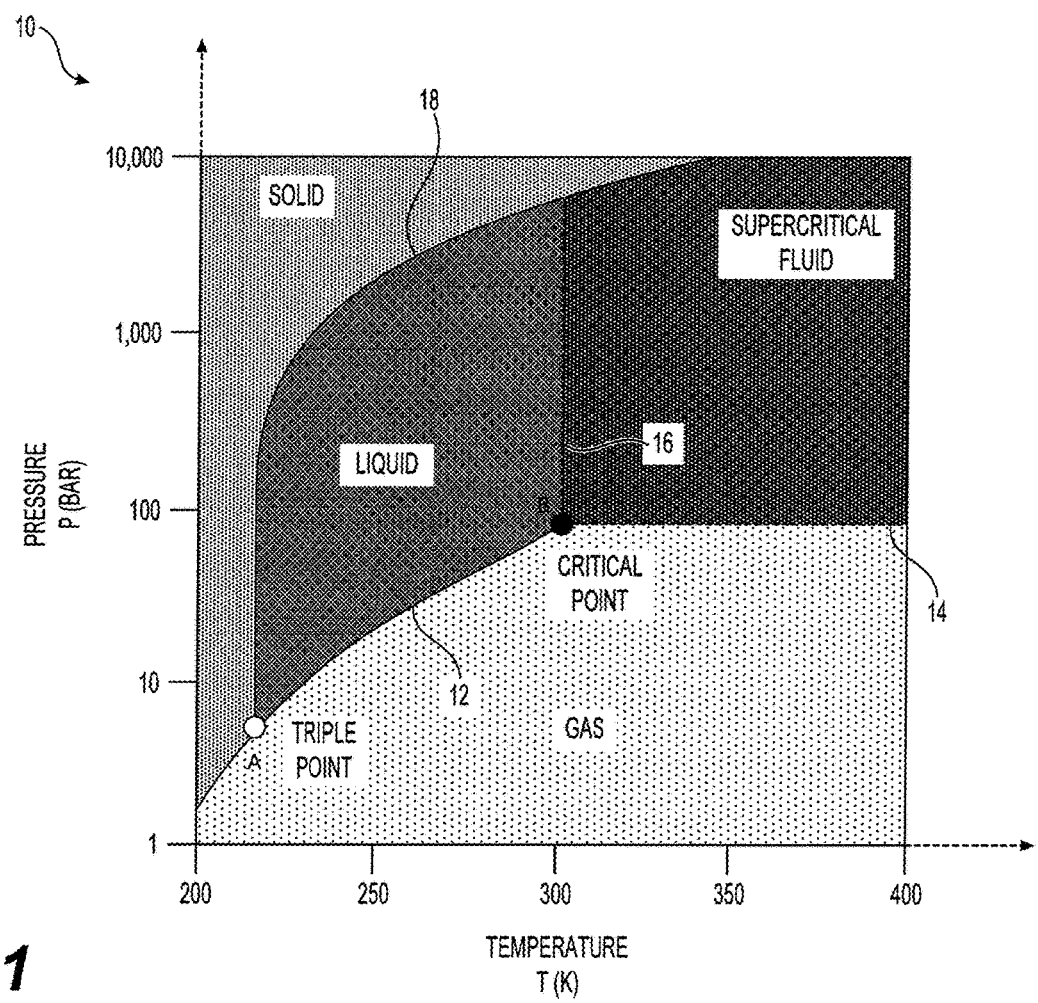
FIG. 1 is an exemplary phase diagram of $CO_2$ in accordance with some embodiments.

The following disclosure provides many different embodiments, or examples, for implementing different features of the provided subject matter. Specific examples of components and arrangements are described below to simplify the present disclosure. These are, of course, merely examples, and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the apparatus in use or operation in addition to the orientation depicted in the figures. The apparatus may be otherwise oriented (rotated 90 degrees or at other orientations) and the spatially relative descriptors used herein may likewise be interpreted accordingly.

Reference throughout the specification to "one embodiment" or "an embodiment" means that a particular feature, structure, material, or characteristic described in connection with the embodiment is included in at least one embodiment, but do not denote that they are present in every embodiment. Thus, the appearances of the phrases "in one embodiment" in various places through the specification are not necessarily referring to the same embodiment. Furthermore, the particular features, structures, materials, or characteristics may be combined in any suitable manner in one or more embodiments.

Key constraints that the present disclosure addresses are the need to perform measurements of optical index of refraction inside a volume, and not at the interface or in a thin film. The measurement needs to be performed remotely, and with limited access to a high temperature and high pressure chamber. The measurement needs to be performed in real time, and in a cost-effective manner, and with sufficient accuracy (<0.01), high stability/resolution (<0.005), and over relatively large range of indices of refraction (e.g., from 1.00 to 1.50).

Given these constraints, fiber optic and other probes which need to be inserted into the media, are not suitable because of remote measurement requirements. Traditional geometric methods such as critical/Brewster angle/Abbe refractometer are impractical because of space constraints. Wave optic methods such as interference fringe counting may not provide sufficient range and raise some stability concerns. Reflectivity and absorption methods require a reference and may have limited sensitivity.

An apparatus disclosed herein applies a direct imaging method that registers the position of the illumination beam on a detector after the beam passes through a measurement chamber and experiences refraction, and correlates the position of the illumination beam with the value of optical index of refraction of the substance in the chamber. It has been observed that the apparatus described herein is able to perform measurements of optical index of refraction inside a volume, and not at the interface or in a thin film. The measurement is performed remotely, and with limited access to a high temperature and high pressure chamber. The measurement is performed in real time, and in a cost-effective manner, and with sufficient accuracy (<0.01), high stability/resolution (<0.005), and over relatively large range of indices of refraction (e.g., from 1.00 to 1.50).

FIG. 1 is an exemplary phase diagram 10 of $CO_2$ in accordance with some embodiments. As shown in FIG. 1, the $CO_2$ can have four phases (or states) that include solid, liquid, gas, and supercritical fluid. Four lines of equilibrium or phase boundaries 12-18 are included in the phase diagram 10. The lines of equilibrium mark conditions (e.g., temperature and pressure) under which multiple phases can coexist at equilibrium. Phase transitions occur along lines of equilibrium. The phase diagram 10 further includes a triple point A and a critical point B. The triple point mark conditions at which three different phases can coexist. As shown in FIG. 1, at the triple point A, gas, solid, and liquid can coexist. The triple point of $CO_2$ is about 5.1 bar (517 kPa) at 217 K. The critical point B reflects the fact that, at extremely high temperatures and pressures, the liquid and gaseous phases become indistinguishable, in what is known as a supercritical fluid. As show in FIG. 1, the $CO_2$ behaves as a supercritical fluid above its critical temperature (i.e., 304.25 K) and critical pressure (i.e. approximately 7.4 MPa). While in the supercritical phase, the $CO_2$ can flow like a gas but with a density like that of a liquid, and is able to dissolve e.g. IPA.

Figure 2:
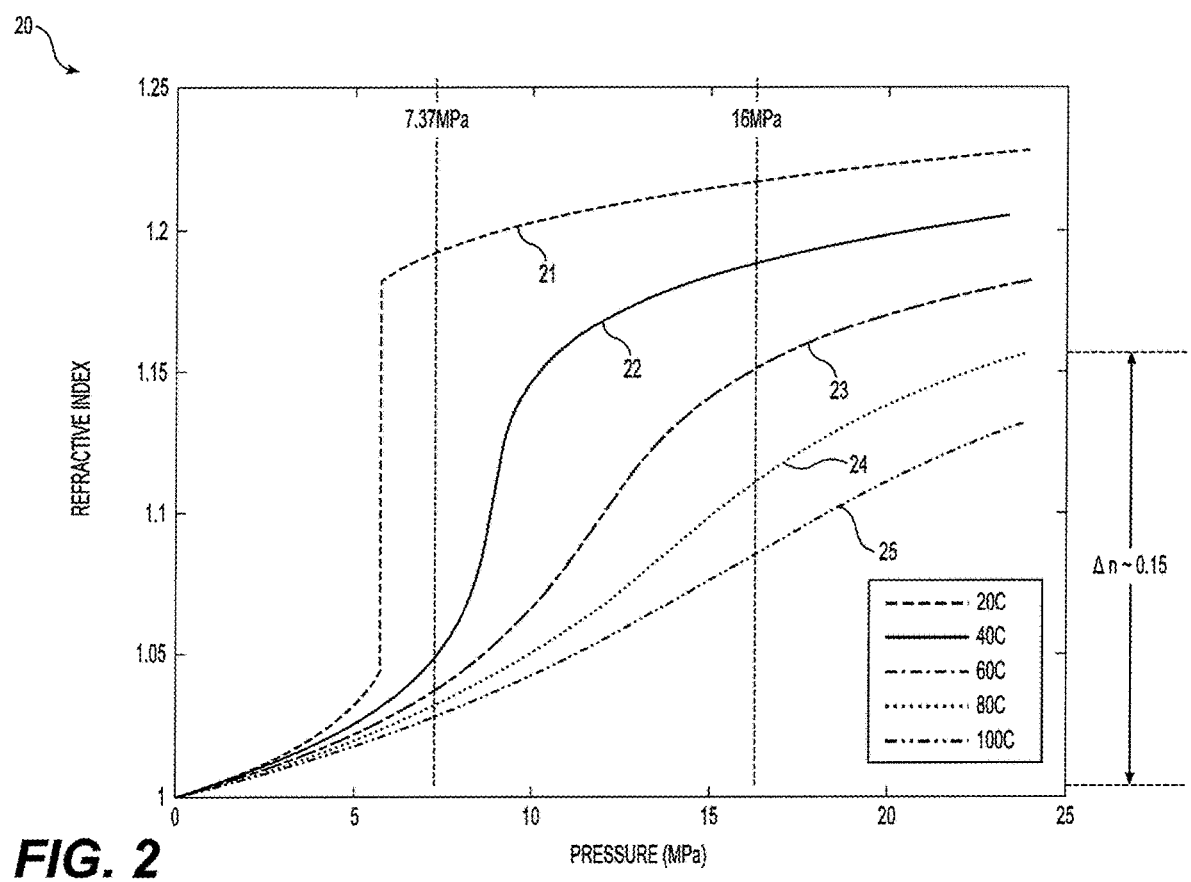
FIG. 2 is a diagram of optical refractive index of supercritical $CO_2$ fluid, in accordance with some embodiments.

FIG. 2 is a diagram 20 of optical refractive index of supercritical $CO_2$ fluid, in accordance with some embodiments. As shown in FIG. 2, the refractive index of $CO_2$-varies for different phases (e.g., gaseous, liquid, and supercritical fluid). Five exemplary curves 21-25 are included in the FIG. 2 to demonstrate the relationship between the refractive index and the conditions (e.g., temperature and pressure). For example, curve 24 demonstrates a about 0.15 increment of the refractive index of $CO_2$ when the pressure is increased from about zero to about 24 MPa, and the temperature is maintained at 80° C. According to the phase diagram of FIG. 1, when the temperature is 80° C. and the pressure is about zero, the $CO_2$ has a gaseous phase, and when the temperature is 80° C. and the pressure is about 24 MPa, the $CO_2$ has a supercritical phase. FIG. 2 demonstrates that the refractive index of $CO_2$ varies from about 1 at a gaseous phase to about 1.15 at a supercritical phase.

Figure 3:
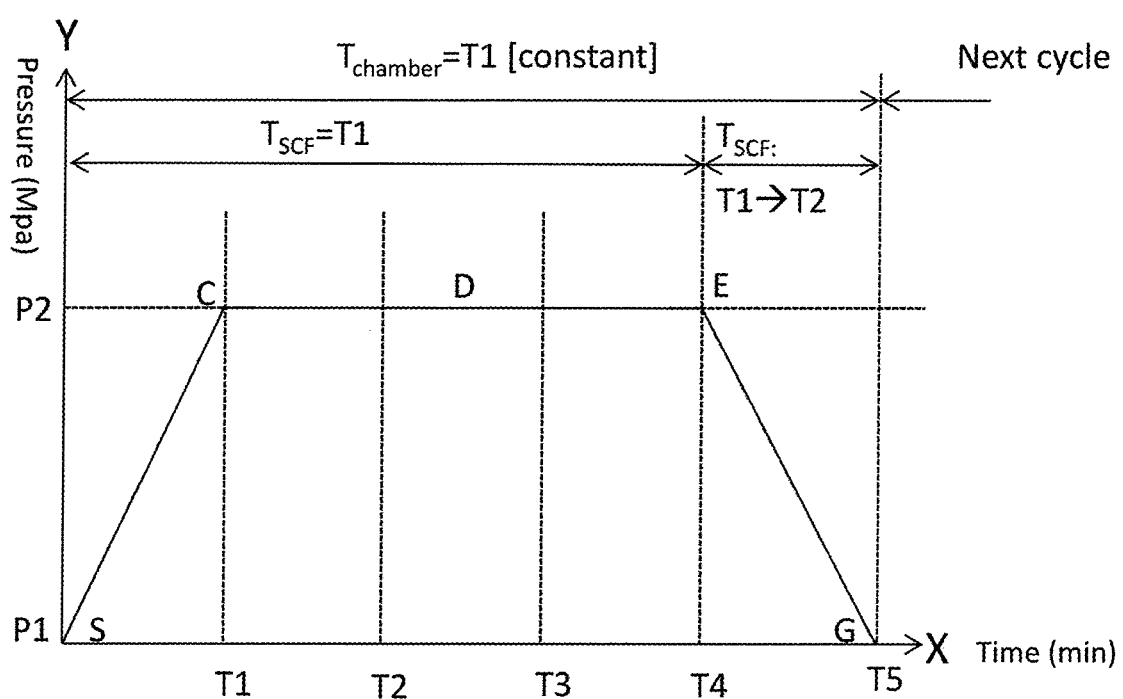
FIG. 3 is a schematic diagram of a wafer clean cycle based on supercritical $CO_2$ fluid, in accordance with some embodiments.

FIG. 3 is a schematic diagram of a wafer clean cycle based on supercritical $CO_2$ fluid, in accordance with some embodiments of the present disclosure. The clean cycle starts with point S, a start point. At point S, a wafer covered with IPA is admitted into a processing chamber at a P1 pressure and a T1 temperature. In some embodiments, the P1 pressure is an atmospheric pressure. When the wafer(s) is inside, the processing chamber is locked, and SCF (supercritical fluid) input valve is open. The clean cycle then proceeds to point C, where pressure of the processing chamber reaches a P2 pressure, which is substantially above supercritical CO2 formation pressure of 7.4 MPa, as the supercritical $CO_2$ fluid is continuously introduced into the processing chamber and starts to dissolve IPA. At point C, an exit valve is open to allow supercritical CO2 fluid to carry dissolved IPA away from the wafer and outside the chamber. As the cleaning process proceeds over point D, the IPA is replaced by the supercritical $CO_2$ fluid and carried away. When the clean cycle proceeds to point E, a transition point, the IPA mass content in the processing chamber is reduced to about 0%, and the SCF input valve is closed. Starting with point E, the pressure of the processing chamber goes down as the SCF input value is closed and the exit value is still open. The supercritical $CO_2$ fluid transits to vapor $CO_2$ when the pressure of the processing chamber is below 7.4 MPa. When the clean cycle reaches point G, an end point, the pressure of the processing chamber is reduced P1, and the exiting $CO_2$ is adiabatically cooled from T1 to T2. At that point X chamber is opened, cleaned wafer(s) is removed, and the cleaning process may be repeated.

Figure 4:
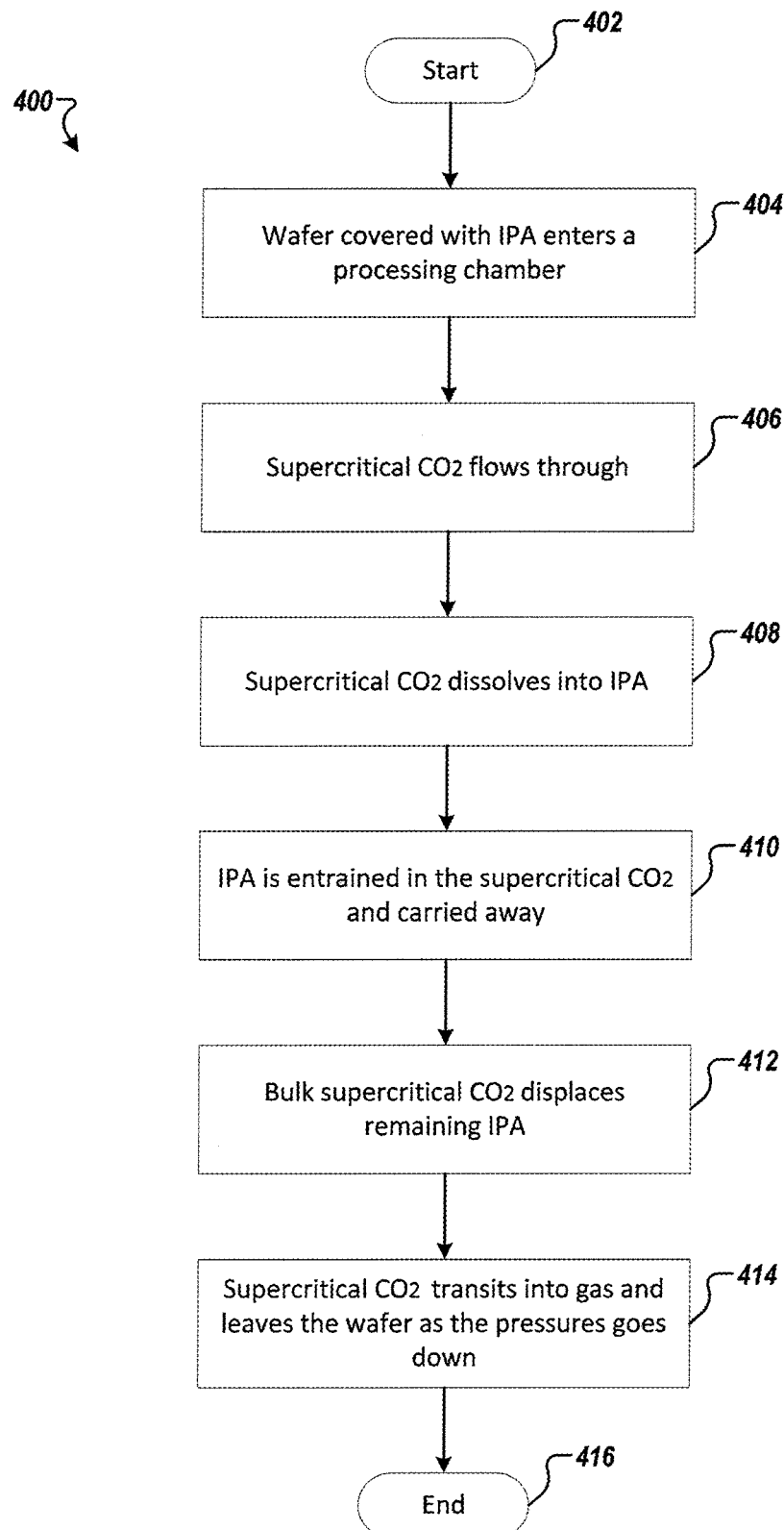
FIG. 4 is an exemplary flowchart of a wafer clean cycle based on supercritical $CO_2$ fluid, in accordance with some embodiments.

FIG. 4 is an exemplary flowchart 400 of a wafer clean cycle based on supercritical $CO_2$ fluid, in accordance with some embodiments of the present disclosure. The clean cycle starts with 402 where the supercritical $CO_2$ fluid is maintained in a supply pipe. At step 404, a wafer covered with IPA enters a processing chamber. In some embodiments, the wafer can have a plurality of micro-structures. The micro-structures can be openings with a width and a height. The IPA can be trapped in the openings from a prior processing step, such as an IPA dry process. At step 406, the supercritical $CO_2$ fluid is introduced to the processing chamber via an input valve and the supercritical $CO_2$ fluid flows through top surface of the wafer. At step 408, as more and more supercritical $CO_2$ fluid is introduced into the processing chamber, supercritical $CO_2$ fluid dissolves into IPA that is trapped in the openings. At step 410, as the processing time goes on, the IPA is entrained in the supercritical $CO_2$ fluid and carried away. At step 412, bulk supercritical $CO_2$ fluid displaces remaining IPA as the processing time goes on. At step 414, the input value is closed while the exit valve is still on, and the pressure of the processing chamber goes down. The supercritical $CO_2$ fluid transits into gas and leaves the wafer as the pressure goes down. The flowchart 400 demonstrates a clean method that has about zero surface tension. The clean method illustrated in flowchart 400 has no formation of a liquid-gas-solid meniscus which can lead to damage of structures on the substrate due to capillary forces.

Figure 5A:
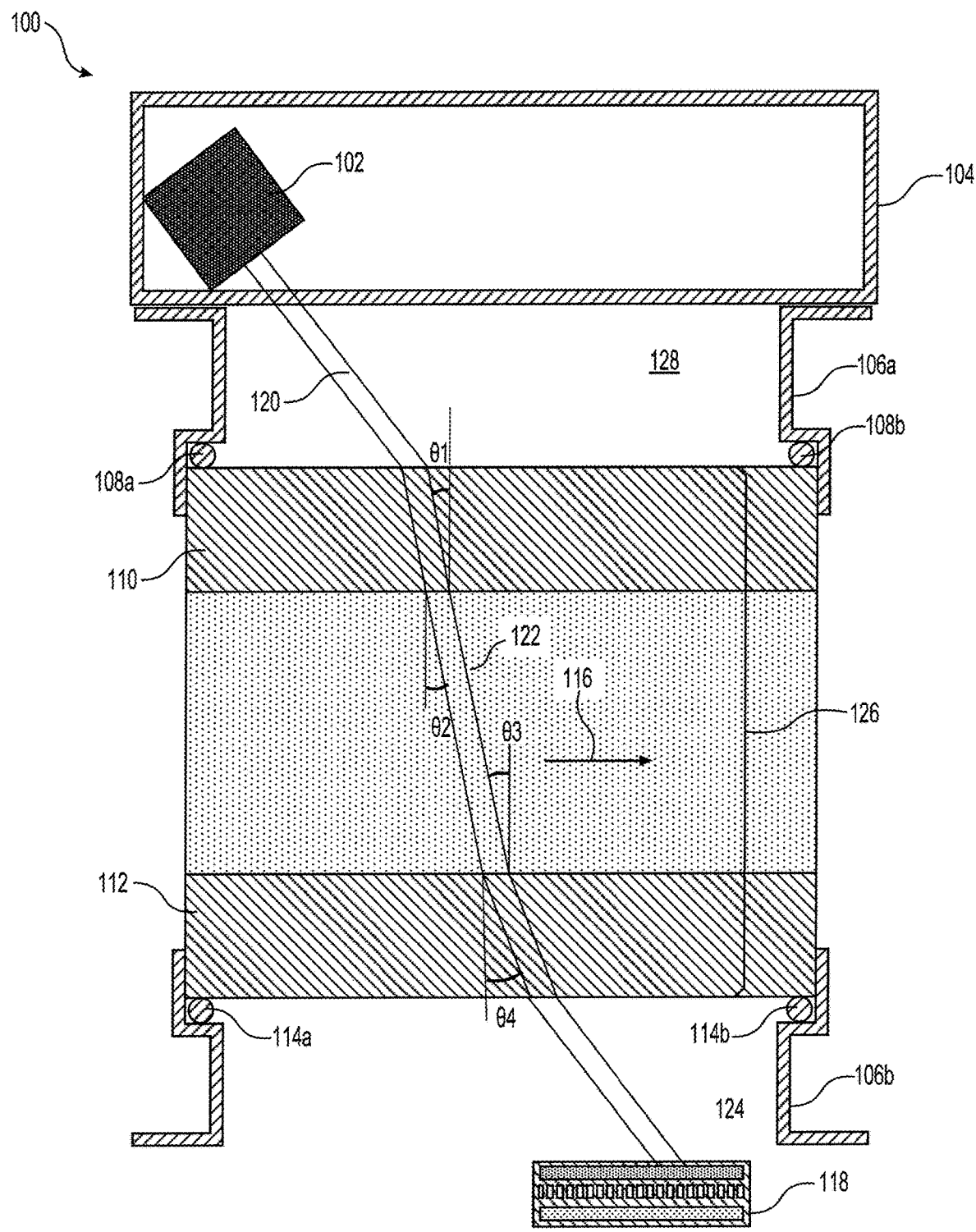
FIG. 5A is a schematic view of an exemplary single-pass type optical sensor for determining phases and conditions of supercritical $CO_2$ fluid, in accordance with some embodiments.

FIG. 5A is a schematic view of an exemplary single-pass type optical sensor 100 for determining the phases and conditions of supercritical $CO_2$ fluid, in accordance with some embodiments. The optical sensor 100 can have a light source 102. The light source 102 can be a laser diode that generated a visible incident light beam 120 in a wavelength from 390 nm to 700 nm. The light source can also include a focusing lens (not shown) to reduce the diffraction of the generated incident light beam 120. The light source 102 can further include beam-shaping optics (not shown) to modulate the incident beam into a line-shaped light beam or other structure/patterned light beams. In an embodiment of FIG. 5A, the beam-shaping optics is a diffractive optical element configured to modulate the incident light beam into a sheet beam with a Gaussian profile. The sheet beam can be centered at 650 nm with a range from 645 nm to 655 nm.

The optical sensor can include a container 104 and the light source 102 can be mounted in the container 104. The optical sensor 100 can have a measurement chamber 126 capable of sustaining high temperature and pressure, such as 80° C. and 16 MPa. A substance 116 (e.g., supercritical $CO_2$ fluid) can be either retained in the measurement chamber 126 or flow through the measurement chamber 126 depending on different designs. The measurement chamber 126 has an entrance window 110 positioned on a top side of the measurement chamber 126 and an exit window 112 positioned on a bottom side of the measurement chamber 126. The entrance window 110 and the exit window 112 can be made of glass capable of sustaining high temperature and pressure. The entrance window 110 and the exit window 112 can also be transparent to the incident light beam 120. In an embodiment of FIG. 5A, the entrance window 110 and the exit window 112 can be made of Borosilicate glass.

An upper shell 106a is included in the optical sensor 100 to provide a connection between the container 104 and the measurement chamber 126. Upper seals 108a and 108b can be mounted in the interface of the entrance window 110 and the upper shell 106a for leakage prevention. A gap 128 can exit between the container 104 and the entrance window 110. In one embodiment, the gap 128 can be under atmospheric pressure. In another embodiment, optical elements, such as relay optics, a protective glass, or an optical filter can be installed in the gap 128. In addition, lower seals 114a and 114b are mounted in the interface of the exit window 112 and the lower shell 106b for bonding improvement. The shells 106 can be made of copper, copper alloy, aluminum, aluminum alloy, stainless steel, or other suitable materials.

The light source 102 is mechanically positioned at a non-zero angle with respect to a normal of the entrance window 110. The incident light beam 120 has a non-zero angle of incidence with respect to the normal of the entrance window 110. The angle of incidence of the incident light beam can be between zero and 90 degrees with respect to the normal of the entrance window 110. The incident light beam 120 can be an incident sheet beam with a Gaussian profile, an incident sheet beam with a flat top profile, an incident pencil beam in the form of a narrow cone or cylinder, an incident Gaussian beam, or beams with other shapes depending on the design requirements. The light source 102 further can include a structured illuminator (not shown) for generating multiple pencil beams, multiple Gaussian beams, illumination profiles with dark spots, multiple parallel lines, patterns formed by intersecting lines, or patterns formed by concentric circles. In an embodiment of FIG. 5A, the incident light beam 120 is a sheet beam with a Gaussian profile that is centered at 650 nm with a range from 645 nm to 655 nm.

Still referring to FIG. 5A, the incident light beam 120 is directed to the entrance window 110 with a non-zero angle of incidence and becomes refracted when crossing the interface at input of the entrance window. In an embodiment of FIG. 5, a refractive index of medium (e.g., air) in the gap 128 is smaller than a refractive index of the entrance window 110 and therefore, according to the Snell's law, the angle of refraction within the entrance window is less than the angle of incidence at the input of the entrance window. This refraction is shown in FIG. 5A, but is not labeled with an angle variable because the refraction is constant based on the properties of the gap 128 and entrance window 110.

The beam passes through the entrance window 110 at an angle of incidence $\theta 1$ with respect to the interface at the substance 116 and crosses this interface to form a refractive light beam 122 with an angle of refraction $\theta 2$ in the substance 116. In the embodiment of FIG. 5A, the angle of refraction $\theta 2$ of the refractive light beam 122 is less than the angle of incidence $\theta 1$ of the light beam within the window. This angle of refraction $\theta 2$ changes with changes in properties of the substance 116 (e.g., supercritical $CO_2$ fluid). The refractive light beam 122 further passes through the substance 116 and the exit window 112 and forms an output light beam 124. In an embodiment of FIG. 5A, the refractive index of the exit window 112 is bigger than a refractive index of the substance 116. Correspondingly, an angle of incidence $\theta 3$ of the refractive light beam 122 is less than an angle of refraction $\theta 4$ of the light beam within the exit window. The relationship between angles $\theta 2$, $\theta 3$ and $\theta 4$ may change based on spatial non-uniformity of the substance 116. The light passes through the exit window and exits (with another refraction angle) to become output light beam 124.

The output light beam 124 reaches a detector 118. The detector 118 is positioned under the exit window 112, and configured to collect the output light beam passing through the exit window 112 and generate measurement data. The detector 118 includes a two-dimensional (2D) imaging multi-pixel (CMOS or CCD) sensor, a one-dimensional (1D) line (line-scan) sensor, a single-pixel position-sensitive sensor, or the like. In some embodiments, a protective glass, a filter, or a focusing optical element can be introduced on the detector surface to minimize stray light and maximize detector sensitivity. As mentioned above, in an embodiment of FIG. 5A, the incident light beam 120 is a sheet beam after being modulated by the beam-shaping optics (not shown). The incident light beam 120 passes through the entrance window 110, the substance 116, and the exit window 112 to form the output light beam 124. When the substance 116 is under a stable state with a constant refractive index in the measurement chamber, the incident light beam can propagate in the substance with the sheet-shaped pattern, and the output light beam 124 can carry over the sheet-shaped pattern and form a light line on the detector 118. However, when the substance 116 has an unstable state (e.g., transition from gas to liquid), or has poor uniformity in the measurement chamber, incident light beam can be dispersed in the substance due to a varying refractive index, and the output light beam 124 can have a corresponding scattered or dispersed pattern projected on the detector 118. In addition, positions of the light line on the detector 118 can vary when different substance 116 is introduced to the measurement chamber 126 due to the change of the refractive index.

As the index of refraction of the substance inside the measurement chamber changes, so does the direction of propagation of the light beam in the substance. At the exit window, the light beam falls onto the sensor that detects the beam centroid position. Accurate calibration can be performed to establish the relationship between the beam centroid position and the refractive index of the substance. Accurate measurement of the index of refraction inside the chamber is obtained via the optical sensor 100 based on the relationship between the beam centroid position and the refractive index of the substance. When a structured (patterned) illumination, such as a sheet beam 120, is used, the sensor may also allow the measurement of the spatial or temporal distribution of the index of refraction across different locations inside the measurement chamber.

Given a theoretically or experimentally established relationship between the optical index of refraction, temperature, pressure, and physical state of substance (gas, liquid, supercritical), the optical sensor 100 allows accurate determination of the state of substance from the optical index of refraction measurements. Furthermore, the sensor may be able to provide information about the substance uniformity and local state changes inside the volume being examined, such as the formation of gas bubbles inside a liquid, cavitation, etc.

The detector 118 can receive the output light beam 124 and generate electrical signal. The electrical signal can be sent to processing circuitry. The processing circuitry can perform signal processing to generate measurement data that registers a beam centroid position of the output light beam on the detector 118. Some exemplary measurement data can be shown in FIGS. 9-12. The measurement data also includes an average value of optical index of refraction over the substance in the measurement chamber, a distribution profile of values of optical index of refraction over the substance in the measurement chamber, an average value of transmission coefficient and an average value of absorption coefficient of the substance in the measurement chamber based on intensity of the output light beam reaching the detector, a distribution profile of values of transmission coefficient and a distribution profile of values of absorption coefficient of the substance in the measurement chamber based on the intensity of the output light beam reaching the detector, and a reflectivity value at interface between the substance and the exit window based on intensity of the reflected light beam reaching the detector. Distribution profiles may be spatial at a snapshot in time, or temporal to show dynamic changes in distribution.

Figure 6:
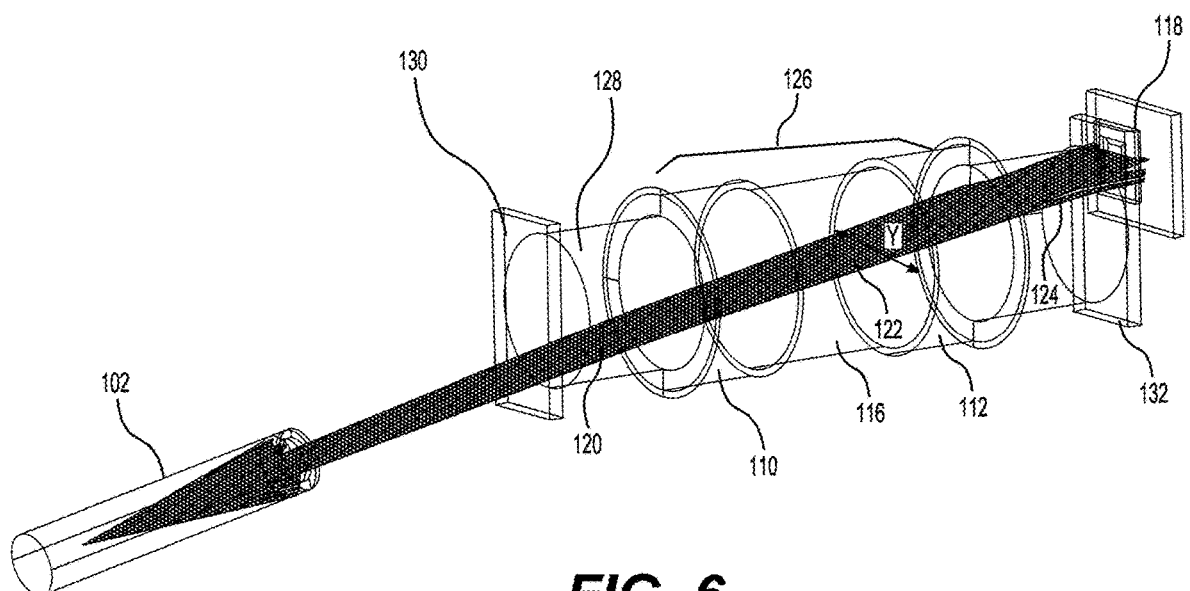
FIG. 6 is a simulation result of an exemplary operation of a single-pass type optical sensor, in accordance with some embodiments.

FIG. 6 is a simulation result of an exemplary operation of a single-pass type optical sensor, in accordance with some embodiments. As shown in FIG. 6, the incident light beam 120 is generated by the light source 102. The incident light beam 120 can be modulated into a sheet beam via the beam-shaping optics (not shown) of the light source 102. The incident light beam 120 passes through an optical filter 130 and then propagates through the gap 128. The optical filter 130 is configured to selectively transmit light with a certain wavelength, such as 650 nm. The incident light beam 120 further passes through the entrance window 110 and enters the substance 116 to form the refractive light beam 122. As shown in FIG. 6, a coordinate Y across the substance 116 in the measurement chamber can be applied. The coordinate Y can tell locations inside the measurement chamber. The refractive light beam 122 further passes through the exit window 112 to form the output light beam 124. The output light beam 124 further propagates and reaches the detector 118. Prior to reaching the detector 118, an optical element 132, such as a protective glass, a filter, or a focusing optical element, can be introduced on the detector surface to minimize stray light and maximize detector sensitivity. The detector 118 collects the output light beam 124 and generates electrical signals. The generated electrical signal is sent to the processing circuitry for analysis. The processing circuitry can perform signal processing to generate measurement data. Some exemplary measurement data can be shown in FIGS. 10-12.

Figure 5B:
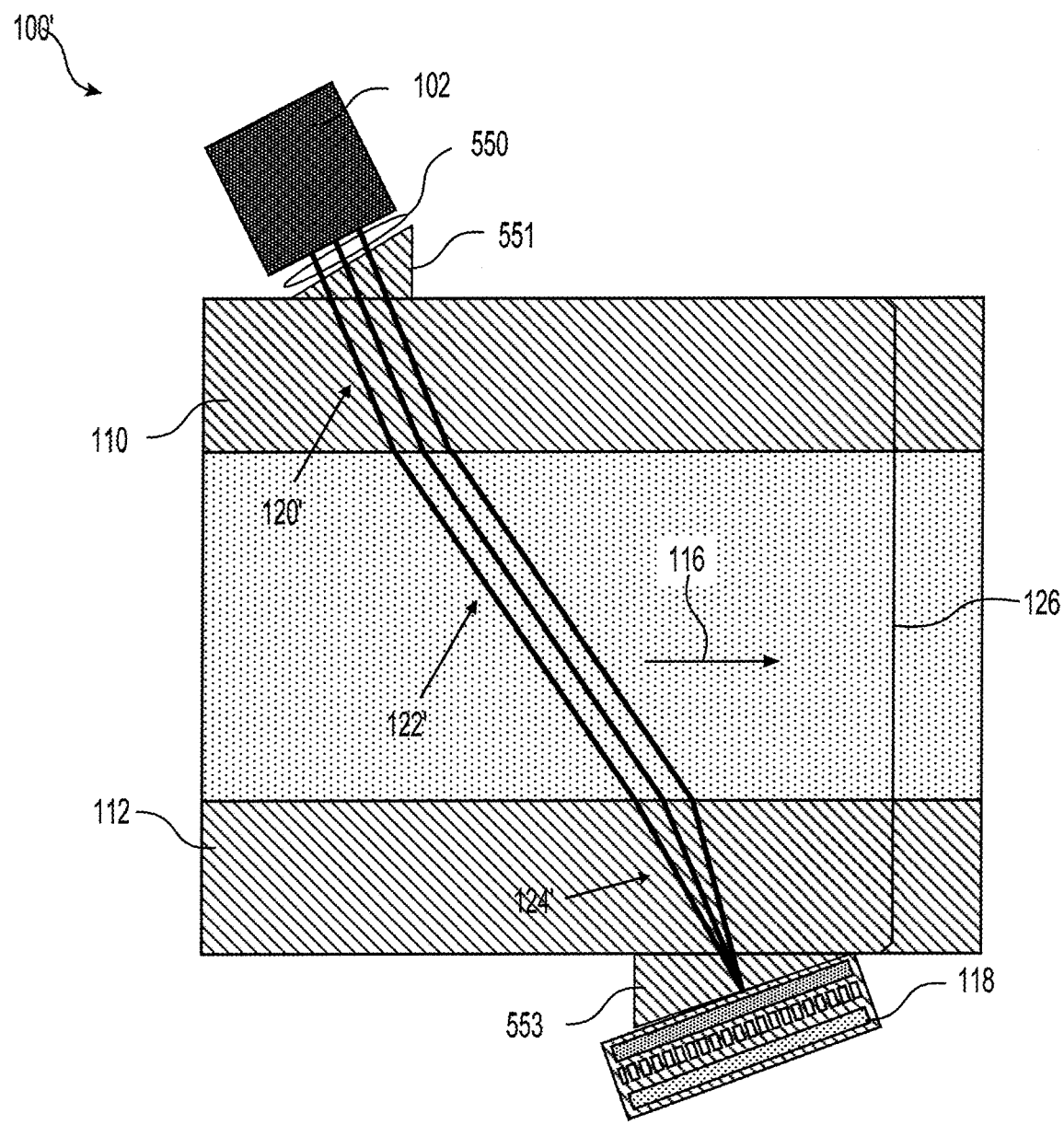
FIG. 5B is a schematic view of another exemplary single-pass type optical sensor for determining phases and conditions of supercritical $CO_2$ fluid, in accordance with some embodiments.

FIG. 5B is a schematic view of another exemplary single-pass type optical sensor for determining phases and conditions of supercritical $CO_2$ fluid, in accordance with some embodiments. As seen, the sensor 100' includes light source 102 that outputs three pencil beams to a focusing lens 550 and light bending input prism 551 to provide incident beams 120'. The incident beams 120' become refracted beams 122', which become output light beams 124' when passing through the exit window 112 Further, the output light 124' passes through another prism 553 before reaching the detector 118.

Figure 7:
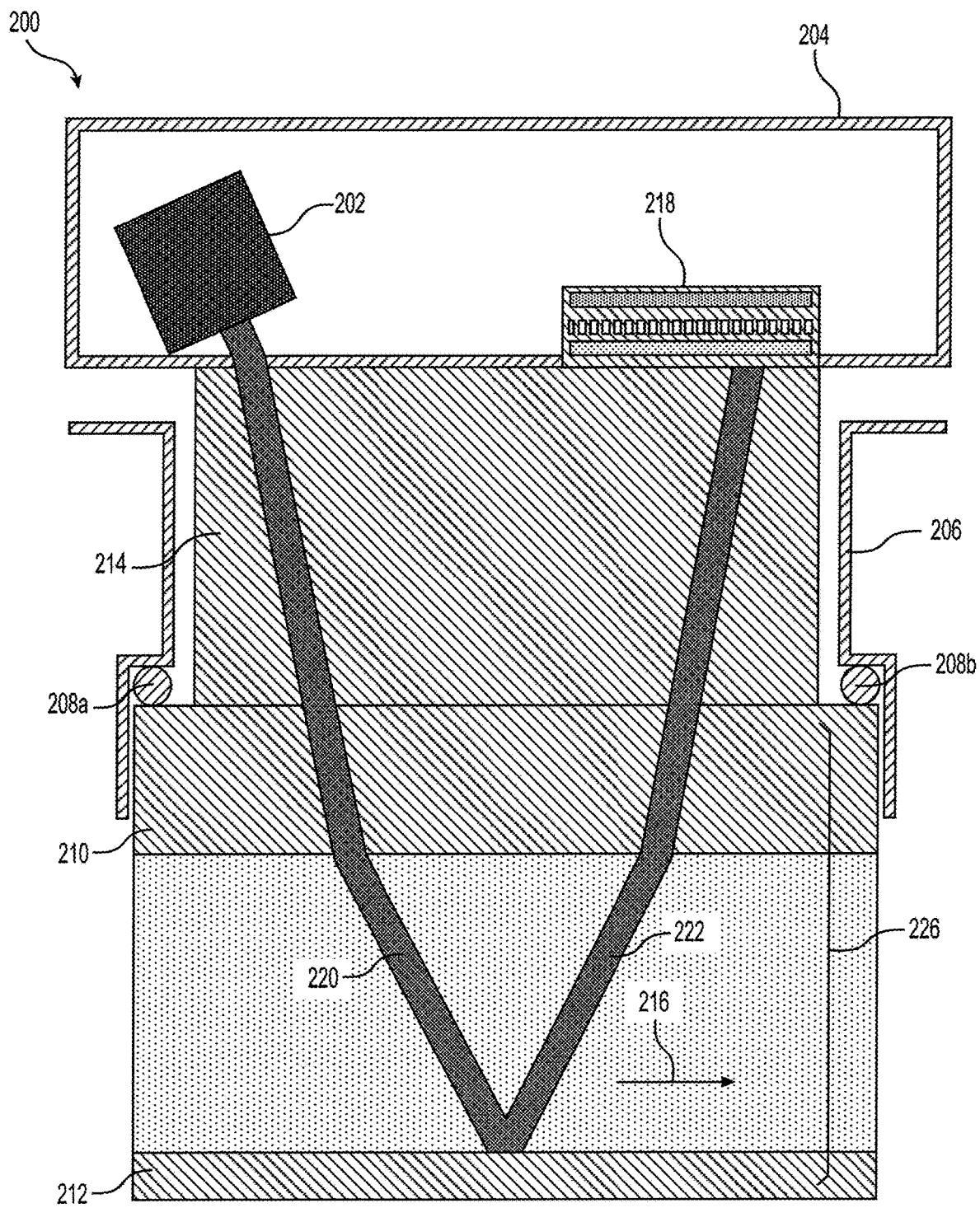
FIG. 7 is a schematic view of an exemplary dual-pass type optical sensor for determining the phases and conditions of supercritical $CO_2$ fluid, in accordance with some embodiments.

FIG. 7 is a schematic view of an exemplary dual-pass type optical sensor 200 for determining the phase and conditions of supercritical $CO_2$ fluid, in accordance with some embodiments. The optical sensor 200 can have a light source 202. The light source 202 can be a laser diode that generated a visible incident light beam 220 in a wavelength from 390 nm to 700 nm. The light source can also include a focusing lens (not shown) to reduce the diffraction of the generated incident light beam 220. The light source 202 can further include beam-shaping optics (not shown) to modulate the incident beam into a line-shaped light beam or other structure/patterned light beams. In an embodiment of FIG. 7, the beam-shaping optics is a diffractive optical element configured to modulate the incident light beam into a sheet beam with a Gaussian profile. The sheet beam can be centered at 650 nm with a range from 645 nm to 655 nm.

The optical sensor 200 can include a container 204 and the light source 202 can be mounted in the container 204. The optical sensor 200 can have a measurement chamber 226 capable of sustaining high temperature and pressure substantially above critical point where supercritical fluid may exist. A substance 216 (e.g., supercritical $CO_2$ fluid) can be either retained in the measurement chamber 226 or flow through the measurement chamber 226 depending on different designs. The measurement chamber 226 has an entrance window 210 positioned on a top side of the measurement chamber and an exit window 212 positioned on a bottom side of the measurement chamber 226. The entrance window 210 and the exit window 212 can be made of glass capable of sustaining high temperature and pressure. The entrance window 210 can also be transparent to the incident light beam 220, however, the exit window is reflective as shown. In an embodiment of FIG. 7, the entrance window 210 and the exit window 212 can be made of Borosilicate glass, but the exit window may be modified to have suitable reflective properties.

A shell 206 is included in the optical sensor 200 to provide a connection between the container 204 and the measurement chamber 226. Seals 208a and 208b can be mounted in the interface of the entrance window 210 and the shell 206 for connection improvement. An optional relay optics 214 can exist between the container 104 and the entrance window 110. In one embodiment, the optional relay optics 214 can be made of a same material. In another embodiment, the relay optics 214 can be a protective glass, or a filter configured to selectively transmit light with a certain wavelength, such as 650 nm. The shell 206 can be made of copper, copper alloy, aluminum, aluminum alloy, stainless steel, or other suitable materials.

The light source 202 is mechanically positioned at a non-zero angle with respect to a normal of the entrance window 210. The incident light beam 220 has a non-zero angle of incidence with respect to the normal of the entrance window 210. The angle of incidence of the incident light beam can be from zero to 90 degrees with respect to the normal of the entrance window 210. The incident light beam 220 can be an incident sheet beam with a Gaussian profile, an incident sheet beam with a flat top profile, an incident pencil beam in the form of a narrow cone or cylinder, or an incident Gaussian beam. The light source 202 further includes a structured illuminator (not shown) for generating multiple pencil beams, multiple Gaussian beams, illumination profiles with dark spots, multiple parallel lines, patterns formed by intersecting lines, or patterns formed by concentric circles. In an embodiment of FIG. 7, the incident light beam 220 is a sheet beam with a Gaussian profile that is centered at 650 nm with a range from 645 nm to 655 nm.

Still referring to FIG. 7, the incident light beam 220 is incident on the optional relay optics 214 with a non-zero angle of incidence. The incident light beam 220 further passes through the optional relay optics 214, the entrance window 210 and transmits into the substance 216. Because the optional relay optics 214, the entrance window 210 and the substance 216 can have different refractive indices, direction of propagation of the incident light beam 220 can change in the relay optics 214, the entrance window 210 and the substance 216 according to Snell's laws. The incident light beam 120 further propagates in the substance 216 and reaches the exit window 212. The incident light beam 120 can be reflected on a surface of the exit window 212 to faun a reflected light beam 222. The reflected light beam further passes through the substance 216, the entrance window 210, the relay optics 214, and reaches a detector 218.

The detector 218 is mounted in the container 204 and positioned over the optional relay optics 214. The detector 218 is configured to collect the reflected light beam and generate measurement data. The detector 218 includes a two-dimensional (2D) imaging multi-pixel (CMOS or CCD) sensor, a one-dimensional (1D) line (line-scan) sensor, a single-pixel position-sensitive sensor, or the like. In some embodiments, a protective glass, a filter, or a focusing optical element can be introduced on the detector surface to minimize stray light and maximize detector sensitivity. In an embodiment of FIG. 7, the incident light beam 220 is a sheet beam after being modulated by the beam-shaping optics. When the substance 216 is under a stable state with a constant refractive index in the measurement chamber, the incident light beam 220 can propagate in the substance with the sheet-shaped pattern, and the reflected light beam 222 can carry over the sheet-shaped pattern and form a light line on the detector 218. However, when the substance 216 has an unstable state (e.g., transition from gas to liquid), or has poor uniformity in the measurement chamber, the incident light beam can be dispersed in the substance due to a varying refractive index, and the reflected light beam 222 can have a corresponding scattered or dispersed pattern projected on the detector 218. In addition, positions of the light line on the detector 218 can vary when different substances 216 is introduced to the measurement chamber 226 due to the change of the refractive index.

Figure 8:
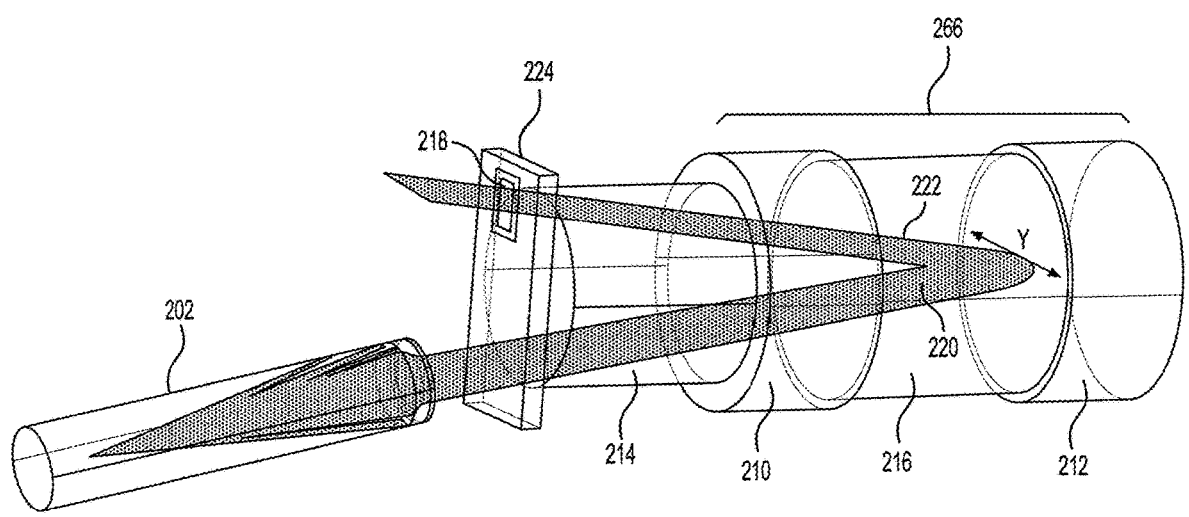
FIG. 8 is a simulation result of an exemplary operation of a dual-pass type optical sensor, in accordance with some embodiments.

FIG. 8 is a simulation result of an exemplary operation of the dual-pass type optical sensor 200, in accordance with some embodiments. As shown in FIG. 8, the incident light beam 220 is generated by the light source 202. The incident light beam 220 can be modulated into a sheet beam via the beam-shaping optics (not shown) of the light source 202. The incident light beam 220 passes through an optical element 224 and then propagates through the relay optics 214. The optical element 224 can be an optical filter configured to selectively transmit light with a certain wavelength, such as 650 nm. The incident light beam 220 further passes through the entrance window 210 and enters the substance 216. On the surface of the exit window 212, the incident light beam is reflected to faun the reflected light beam 222. As shown in FIG. 8, a coordinate Y across the substance 216 in the measurement chamber can be applied. The coordinate Y can tell locations inside the measurement chamber. The reflected light beam 222 passes through the substance 216, the entrance window 210, and the optional relay optics 214. The reflected light beam 222 further transmits through the optical element 224 that is positioned on the surface of the detector 218. In some embodiments, the optical element 224 can also be a protective glass, a filter, or a focusing optical element, and configured to minimize the stray light to improve the sensitivity of the detector 218. The reflected light beam 222 reaches the detector 218 and be collected by the detector 218. The detector 218 generates electrical signals in response to the incident light beam. The generated electrical signal is further sent to the processing circuitry. The processing circuitry can perform signal processing to generate measurement data that registers a beam centroid position of the reflected light beam on the detector 218. Some exemplary simulation data can be seen in FIG. 9.

Figure 9:
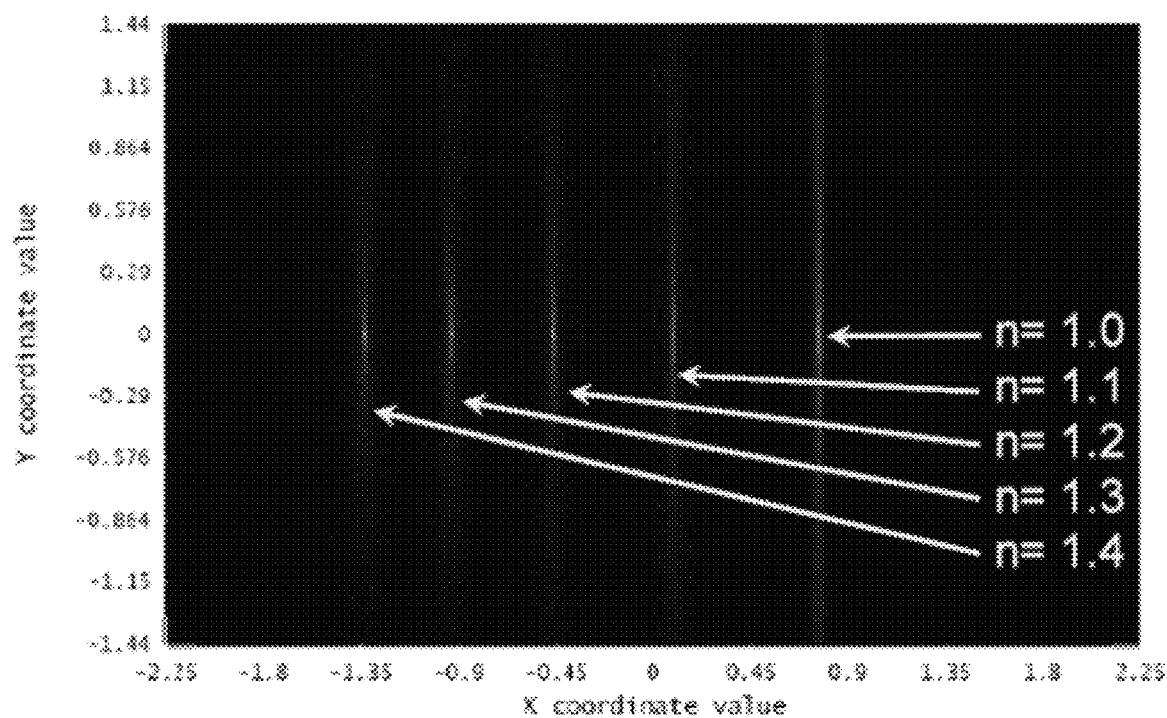
FIG. 9 is a simulation test result of the dual-pass type optical sensor, in accordance with some embodiments.

FIG. 9 is a simulation test result of the dual-pass type optical sensor, in accordance with some embodiments where the incident light beam is a line beam. A corresponding light line is received in the sensor when the received light beam falls onto the sensor. As shown in FIG. 9, an X coordinate provides displacement of the received light beam (e.g., the reflected light beam) that passes through the substance in the measurement chamber of the optical sensor 200 with different refractive indices. A Y coordinate tells locations inside the measurement chamber that is labelled in FIG. 8. The simulation data in the X coordinate of FIG. 9 shows that the received light beam shifts to a same direction (e.g., left of FIG. 9) as the refractive index of the substance increases. In addition, a higher refractive index corresponds to a bigger displacement. The simulation data in the Y coordinate of FIG. 9 also shows that the incident light beam has a less distribution in the substance as the refractive index of the substance increases.

Figure 10:
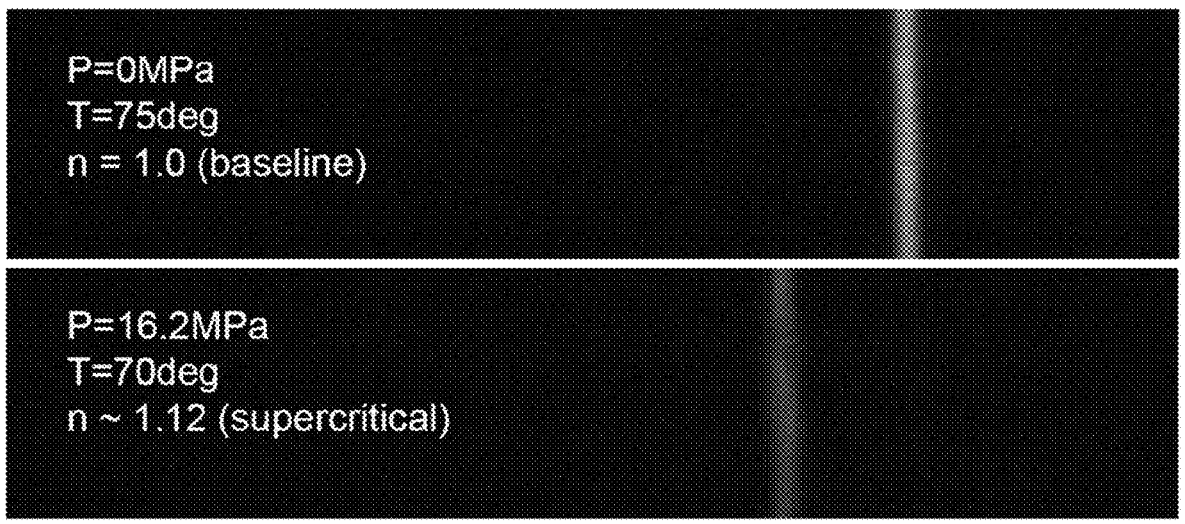
FIG. 10 is a first exemplary test result of the single-pass type optical sensor, in accordance with some embodiments.

FIG. 10 is a first exemplary test result of the single-pass type optical sensor 100, in accordance with some embodiments. The measurement data in X coordinate shows a displacement of an output light beam passing through the supercritical $CO_2$ fluid with respect to the output light beam passing through a baseline substance. The upper part of the FIG. 10 illustrates a collected position of the output light beam on the detector after the output light beam passes through the baseline substance. The lower part of the FIG. 10 illustrates another collected position of the output light beam on the sensor after the output light beam passes through the supercritical $CO_2$ fluid. It can be seen that the output light beam shifts to left of the FIG. 10 as the refractive index increases from 1.12 (supercritical) to 1 (baseline). Based on the structured illumination (e.g., the incident sheet beam 120), the measurement data in Y coordinate shows a uniformly non-dispersed distribution of the index of refraction across Y direction (e.g., a diameter) of the measurement chamber. The uniformly non-dispersed distribution of the index of refraction corresponds to a uniform and stable media inside the measurement chamber of the optical sensor.

Based on the measurement data demonstrated in FIG. 10, accurate calibration can be performed to establish the relationship between the beam centroid position and the refractive index of the substance at different states. Accurate measurement of an in-situ index of refraction inside the chamber can be obtained via the optical sensor based on the relationship between the beam centroid position and the refractive index of the substance at difference states. A state of the substance can be determined based on the obtained in-situ index of refraction. In addition, when a line or structured (patterned) illumination is used, the sensor can also allow the measurement of the distribution of the index of refraction across different locations inside the measurement chamber.

Calibration of the apparatus is the mapping of geometric location of an illuminated line or other pattern on the detector into values of optical index of refraction of the sample substance being tested. Normally, calibration benefits from geometric information about the setup such as angle of incidence and length of measurement chamber. In addition, calibration may benefit from measurements of reference calibration samples with known optical indices of refraction. For example, a one-point calibration (single sample of known index of refraction) allows removal of the dependence on the mechanical offset of detector from the nominal position, a two-point calibration (two samples of differing and known indices of refraction) allows reduced dependence on mechanical offset of chamber length or similar critical geometric parameters from their nominal values, and a three-point calibration may theoretically allow to mitigate the impact on measurements of up to three different geometric parameters of an optical system.

Figure 11:
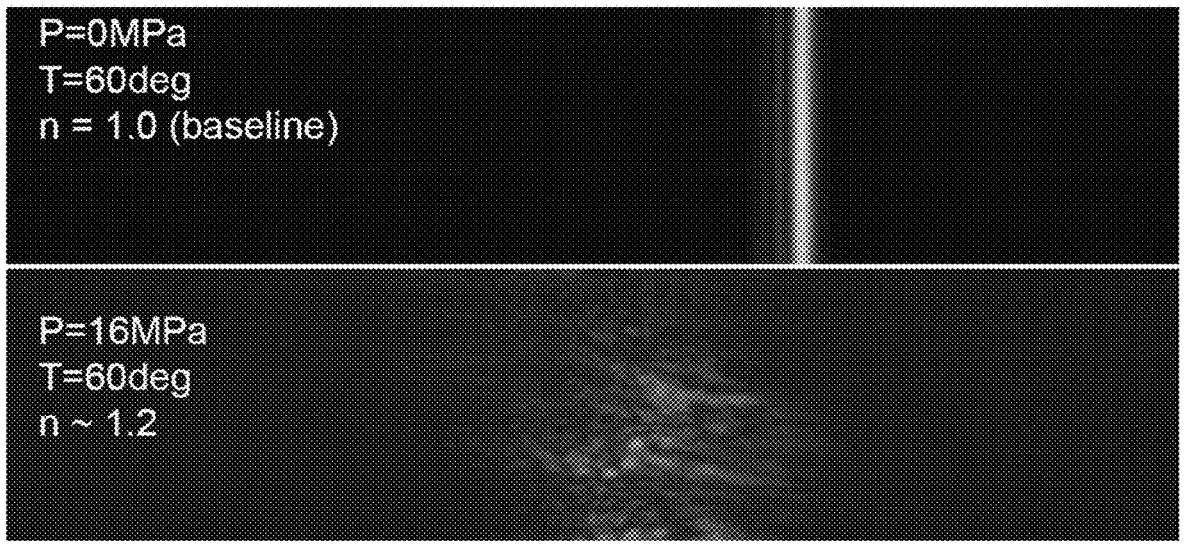
FIG. 11 is a second exemplary test result of the single-pass type optical sensor, in accordance with some embodiments.

FIG. 11 is a second exemplary test result of the single-pass type optical sensor where dispersed/scattered signal is received (lower part of FIG. 11). The dispersed/scattered signal indicates a non-uniform/unstable substance in the measurement chamber of the optical sensor. In some embodiments, the dispersed/scattered signal is corresponding to a transitional regime of the $CO_2$.

Figure 12:
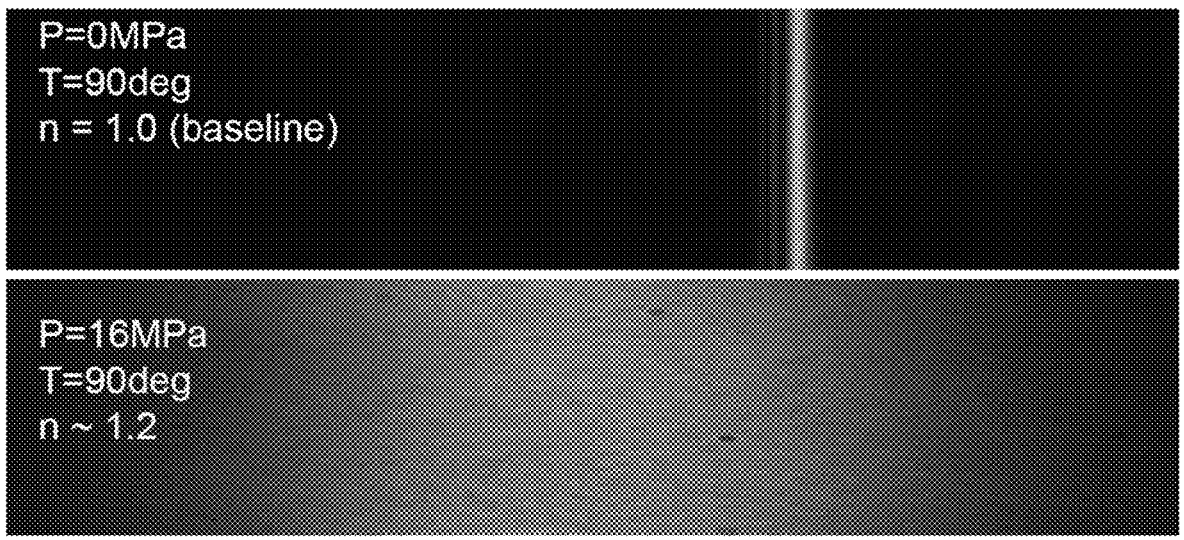
FIG. 12 is a third exemplary test result of the single-pass type optical sensor, in accordance with some embodiments.

FIG. 12 is a third exemplary test result of the single-pass type optical sensor, where even more dispersed/scattered signal is received comparing to FIG. 11. The more dispersed/scattered signal indicates a breakdown of supercritical $CO_2$ state in the measurement chamber of the optical sensor.

Figure 13:
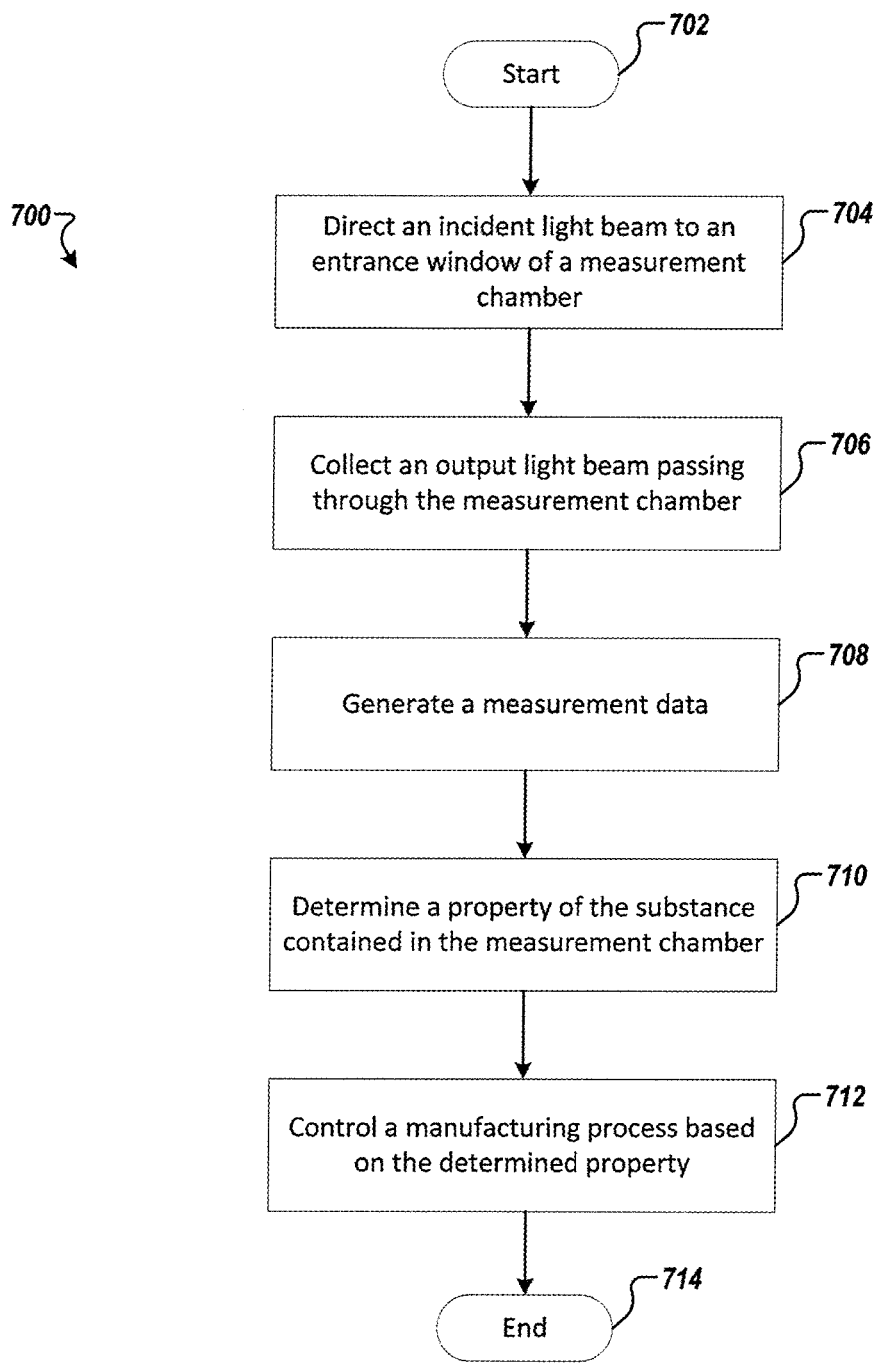
FIG. 13 is a flowchart that shows a method for in-situ phase monitoring based on an optical sensor, in accordance with some embodiments.

FIG. 13 is a flowchart that shows a method 700 for in-situ phase monitoring based on the optical sensor 100 or 200, in accordance with some embodiments. The method 700 starts with step 702 where the supercritical $CO_2$ fluid is flowing through the measurement chamber of the optical sensor. At step 704, the incident light beam is directed to the entrance window of the measurement chamber. The incident light beam passes through the entrance window, the supercritical $CO_2$ fluid, and the exit window to faun the output light beam. The output light beam falls onto the detector. At step 706, the detector collects the output light beam passing through the entrance window, the supercritical $CO_2$ fluid, and the exit window, and generates electrical signal. At step 708, the electrical signal is sent to the processing circuitry. The processing circuitry performs signal processing to generate the measurement data.

The measurement data includes an average value of optical index of refraction over the substance in the measurement chamber, a distribution profile of values of optical index of refraction over the substance in the measurement chamber, an average value of transmission coefficient and an average value of absorption coefficient of the substance in the measurement chamber based on intensity of the output light beam reaching the detector, a distribution profile of values of transmission coefficient and a distribution profile of values of absorption coefficient of the substance in the measurement chamber based on the intensity of the output light beam reaching the detector, and a reflectivity value at interface between the substance and the exit window based on intensity of the reflected light beam reaching the detector.

The method 700 then proceeds to step 710 where a property (e.g., phase condition) of the substance (e.g., supercritical $CO_2$ fluid) retained in the measurement chamber of the optical sensor can be determined based on the measurement data. For example, based on the measurement data shows in FIGS. 10-12, the phase condition of the $CO_2$ can be determined, where the $CO_2$ is under a supercritical state in FIG. 10, under a transition regime in FIG. 11, and under a breakdown state in FIG. 12. A corresponding control can be applied at step 712 when the property of the substance is determined. For example, the clean cycle flowchart 400 illustrated at FIG. 4 can be stopped and the equipment can be checked when the measurement data shows an unstable condition of supercritical $CO_2$ fluid as illustrated in FIG. 11 or FIG. 12.

The development of semiconductor industry wafer cleaning solutions led to the utilization of supercritical fluids to remove cleaning agents from wafer surfaces. One of the challenges is to accurately determine the phase/state of the supercritical fluids in a processing chamber to facilitate the cleaning process. The present disclosure provides a method and apparatus to determine the phase state of a substance by measuring the optical index of refraction in the substance volume, optionally in combination with concurrent measurements of substance temperature and pressure. The disclosure is based on theoretical and experimental studies which show the index of refraction varying for different phases (gaseous, liquid, and supercritical phases) of a same substance. Given a theoretically or experimentally established relationship between the optical index of refraction, temperature, pressure, and physical state of substance (gas, liquid, supercritical), the sensor allows accurate determination of the state of substance from the optical index of refraction measurements. Furthermore, the sensor is able to provide information about the substance uniformity and local state changes inside the volume being examined, such as the formation of gas bubbles inside a liquid, or cavitation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus for in-situ phase determination, the apparatus comprising:
   a measurement chamber configured to retain a substance;
   an entrance window mounted on a side of the measurement chamber;
   an exit window mounted on an opposite side of the measurement chamber, the exit window being parallel with the entrance window;
   a light source configured to generate an incident light beam, the incident light beam being directed to the entrance window at a non-zero angle of incidence with respect to a normal of the entrance window, and the incident light beam passing through the entrance window, the measurement chamber and the exit window to form an output light beam, wherein the non-zero angle of incidence with respect to the normal of the entrance window is larger than zero degree and less than 90 degrees;
   a detector positioned under the exit window, the detector being configured to collect the output light beam passing through the exit window and generate measurement data;
   a focusing lens and a first optical prism, the focusing lens being positioned under the light source, the first optical prism being disposed between the focusing lens and the entrance window; and a second optical prism positioned over the detector, and arranged between the exit window and the detector, wherein:

the incident light beam is directed to the focusing lens and the first optical prism at an angle of incidence less than 10 degrees, and the output light beam is converged and directed to the detector by the second optical prism.

2. The apparatus of claim 1, wherein the entrance window and the exit window are made of borosilicate glass.

3. The apparatus of claim 1, wherein the entrance window and the exit window have different refractive indices.

4. The apparatus of claim 1, wherein the light source comprises a laser diode configured to generate the incident light beam, a focus lens configured to focus the incident light beam to reduce light loss and beam-shaping optics configured to modulate the shape of the incident light beam.

5. The apparatus of claim 4, wherein the light source generates an incident sheet beam with a Gaussian profile, an incident sheet beam with a flat top profile, an incident pencil beam in the form of a narrow cone or cylinder, or an incident Gaussian beam.

6. The apparatus of claim 4, wherein the light source further comprises a structured illuminator for generating multiple pencil beams, multiple Gaussian beams, illumination profiles with dark spots, multiple parallel lines, patterns formed by intersecting lines, or patterns formed by concentric circles.

7. The apparatus of claim 1, further comprising a protective glass, a filter, or a focusing optical element that is introduced on the detector surface to minimize stray light and maximize detector sensitivity.

8. The apparatus of claim 1, wherein the detector includes a two-dimensional (2D) imaging multi-pixel (CMOS or CCD) sensor, a one-dimensional (1D) line (line-scan) sensor, or a single-pixel position-sensitive sensor.

9. An apparatus for in-situ phase determination, the apparatus comprising:

a measurement chamber configured to retain a substance;

an entrance window mounted on a side of the measurement chamber;

an exit window mounted on an opposite side of the measurement chamber, the exit window being parallel with the entrance window;

a light source configured to generate an incident light beam, the incident light beam being directed to the entrance window at a non-zero angle of incidence with respect to a normal of the entrance window, the incident light beam passing through the entrance window, the measurement chamber and being reflected on the exit window to form a reflected light beam; and the reflected light beam passing through the measurement chamber and the entrance window, wherein the non-zero angle of incidence with respect to the normal of the entrance window is larger than zero degree and less than 90 degrees;

a detector mounted above the entrance window, the detector being configured to receive the reflected light beam passing through the entrance window and generate measurement data;

a focusing lens and a first optical prism, the focusing lens being positioned under the light source, the first optical prism being disposed between the focusing lens and the entrance window; and a second optical prism positioned over the detector, and arranged between the exit window and the detector, wherein:

the incident light beam is directed to the focusing lens and the first optical prism at an angle of incidence less than 10 degrees, and the output light beam is converged and directed to the detector by the second optical prism.

10. The apparatus of claim 9, wherein the light source further comprises an optical filter configured to selectively transmit light with a certain wavelength.

11. The apparatus of claim 9, further comprises a protective glass, a filter, or a focusing optical element that is introduced on the detector surface to minimize stray light and maximize detector sensitivity.

12. A method for in-situ phase determination, the method comprising:

directing an incident light beam to a focusing lens, a first optical prism, and an entrance window of a measurement chamber sequentially, the focusing lens being positioned under the light source, the first optical prism being disposed between the focusing lens and the entrance window, the incident light beam being directed to the focusing lens and the first optical prism at an angle of incidence less than 10 degrees, and further being directed to the entrance window at a non-zero angle of incidence with respect to a normal of the entrance window, the entrance window being mounted on an side of the measurement chamber, and the measurement chamber retaining a substance, wherein the non-zero angle of incidence with respect to the normal of the entrance window is larger than zero degree and less than 90 degrees;

collecting, via a detector, an output light beam, the incident light beam passing through the entrance window, the measurement chamber, and an exit window to form the output light beam, the exit window being mounted on an opposite side of the measurement chamber and parallel with the entrance window, the detector being positioned under the exit window, the output light beam being converged and directed to the detector by a second optical prism that is positioned over the detector, and arranged between the exit window and the detector;

generating, by processing circuitry, a measurement data that registers a beam centroid position of the output light beam;

determining a property of the substance retained in the measurement chamber based on the measurement data; and controlling a manufacturing process based on the determined property.

13. The method of claim 12, further comprising collecting a reflected light beam via the detector to register a beam centroid position of the reflected light beam, the incident light beam passing through the entrance window, the measurement chamber, and being reflected on an exit window to form the reflected light beam, the exit window being mounted on an opposite side of the measurement chamber and parallel with the entrance window, the reflected light beam passing through the measurement chamber and the entrance window to reach the detector, and the detector being positioned above the entrance window.

14. The method of claim 13, wherein the measurement data includes an average value of optical index of refraction over the substance in the measurement chamber;

a distribution profile of values of optical index of refraction over the substance in the measurement chamber;

an average value of transmission coefficient and an average value of absorption coefficient of the substance in the measurement chamber based on intensity of the output light beam reaching the detector;

a distribution profile of values of transmission coefficient and a distribution profile of values of absorption coefficient of the substance in the measurement chamber based on the intensity of the output light beam reaching the detector; and a reflectivity value at interface between the substance and the exit window based on intensity of the reflected light beam reaching the detector.

15. The method of claim 12, wherein the determining a property of the substance retained in the measurement chamber based on the measurement data further comprises:

performing calibration to establish a relationship between beam centroid positions and refractive indices of the substance at different states;

obtaining an in-situ index of refraction of the substance inside the measurement chamber via the detector based on the relationship between the beam centroid positions and the refractive indices of the substance at the different states; and determining a state of the substance based on the obtained in-situ index of refraction.

16. The method of claim 15, further comprising obtaining a calibration data, the calibration data including a one-point calibration data based on a single sample introduced in the measurement chamber, a two-point calibration data based on two different samples introduced in the measurement chamber, and a three-point calibration data based on three different samples introduced in the measurement chamber.

17. The method of claim 12, further comprising directing the incident light beam to an optical filter to selectively transmit light with a certain wavelength, prior to directing the incident light beam to the entrance window of the measurement chamber at the non-zero angle of incidence with respect to the normal of the entrance window.

18. The apparatus of claim 9, wherein the light source comprises a structured illuminator for generating multiple pencil beams, multiple Gaussian beams, illumination profiles with dark spots, multiple parallel lines, patterns formed by intersecting lines, or patterns formed by concentric circles.

19. The apparatus of claim 1, further comprising:

a relay optics arranged between the light source and the entrance window and configured to selectively transmit light with a certain wavelength.

20. The apparatus of claim 9, further comprising:

a relay optics arranged between the light source and the entrance window and configured to selectively transmit light with a certain wavelength.

* * * * *